United States Patent
Bi et al.

(10) Patent No.: US 6,858,969 B2
(45) Date of Patent: Feb. 22, 2005

(54) SURFACE ACOUSTIC WAVE DEVICES BASED ON UNPOLISHED NANOCRYSTALLINE DIAMOND

(75) Inventors: Baokang Bi, Okemos, MI (US); Brage Golding, DeWitt, MI (US); Wen-Shin Huang, East Lansing, MI (US); Jes Asmussen, Okemos, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 10/341,514

(22) Filed: Jan. 13, 2003

(65) Prior Publication Data

US 2003/0160542 A1 Aug. 28, 2003

Related U.S. Application Data

(60) Provisional application No. 60/351,955, filed on Jan. 25, 2002.

(51) Int. Cl.[7] .............................................. H01L 41/08
(52) U.S. Cl. ................................................. 310/313 R
(58) Field of Search ............................ 310/313 R, 363

(56) References Cited

U.S. PATENT DOCUMENTS

| | | | |
|---|---|---|---|
| 5,209,916 A | 5/1993 | Gruen | 423/446 |
| 5,320,865 A * | 6/1994 | Nakahata et al. | 427/100 |
| 5,328,676 A | 7/1994 | Gruen | 423/446 |
| 5,370,855 A | 12/1994 | Gruen | 423/446 |
| 5,462,776 A | 10/1995 | Gruen | 427/577 |
| 5,486,800 A | 1/1996 | Davenport | 333/195 |
| 5,571,577 A | 11/1996 | Zhang et al. | 427/575 |
| 5,620,512 A | 4/1997 | Gruen | 117/108 |
| 5,645,645 A | 7/1997 | Zhang et al. | 118/723 MW |
| 5,772,760 A | 6/1998 | Gruen | 117/104 |
| 5,773,911 A | 6/1998 | Tanaka et al. | 310/313 B |
| 5,776,246 A * | 7/1998 | Tanabe et al. | 117/89 |
| 5,814,149 A | 9/1998 | Shintani et al. | 117/104 |
| 5,849,079 A | 12/1998 | Gruen | 117/104 |
| 5,897,924 A | 4/1999 | Ulczynski et al. | 427/577 |
| 5,902,640 A | 5/1999 | Krauss | 427/249 |
| 5,920,143 A | 7/1999 | Tarui et al. | 310/313 A |
| 5,989,511 A | 11/1999 | Gruen | 423/446 |
| 6,051,063 A | 4/2000 | Tanabe et al. | 117/89 |
| 6,127,768 A | 10/2000 | Stoner et al. | 310/313 A |
| 2003/0152700 A1 * | 8/2003 | Asmussen et al. | 427/249.8 |

FOREIGN PATENT DOCUMENTS

| | | | | |
|---|---|---|---|---|
| JP | 6-276049 | * | 9/1994 | H03H/9/25 |
| JP | 8-209347 | * | 8/1996 | C23C/16/02 |

OTHER PUBLICATIONS

Adler, E.L., et al., Proceedings IEEE Ultrasonics Symposium 341 (1995).
McSkimin, J.J., et al., Phys. Rev. 105 116 (1957).
Nakahata, K., et al., IEEE Trans. Ultrasonic, Ferroelect., and Freq. Cont. 42 362 (1995).
Jiang, X., Pys. Rev. B 43 2372 (1991).
Ferrari, A.C., et al., Appl. Phys. Lett. 75 1893 (1999).
Campbell, C., Surface Acoustic Wave Devices and Their Signal Processing Applications, Academic Press, New York (1989).
Yamanouchi, K. et al., Proceedings IEEE Ultrasonics Symposium 351 (1989).
Nakahata, H., et al., Proceedings IEEE Ultrasonics Symposium 377 (1992).

(List continued on next page.)

*Primary Examiner*—Thomas M. Dougherty
(74) *Attorney, Agent, or Firm*—Ian C. McLeod

(57) ABSTRACT

Surface Acoustic Wave (SAW) devices with an unpolished or nominally polished nanocrystalline diamond film, metal electrodes and piezoelectric composition coatings are described. The devices are used as radio frequency and microwave filters.

11 Claims, 3 Drawing Sheets

OTHER PUBLICATIONS

Nakahata, Y.H., et al., ibid 361 (1995).
Fujii, S., et al., ibid 183 (1997).
Dreifus, K.L., et al., ibid 191 (1997).
Nakahata, H., et al., ibid 319 (1998).
Hachigo, A., et al., ibid 325 (1995).
Gruen, D.M., Annu. Rev. Mater. Sci. 29 211 (1999).
Kuo, K.P. and J. Asmussen, Diamond Relat. Mater. 6 1097 (1997).
Foster, N.F., et al., J. Vac. Sci. and Tech. 6 111 (1969).

* cited by examiner

SURFACE ACOUSTIC WAVE DEVICES BASED ON UNPOLISHED NANOCRYSTALLINE DIAMOND

CROSS-REFERENCE TO RELATED APPLICATIONS

This application claims priority to Provisional application Ser. No. 60/351,955, filed Jan. 25, 2002.

GOVERNMENT RIGHTS

The present invention was developed under National Science Foundation Grant DMR-9809688. The U.S. Government may have certain rights to the present invention.

BACKGROUND OF THE INVENTION

(1) Field of the Invention

The present invention relates to surface acoustic wave (SAW) and bulk acoustic wave (BAW) devices with unpolished nanocrystalline diamond which supports the surface acoustic wave. In particular the nanocrystalline diamond is composed of individual grains roughly between 1 nm and 50 nanometers. This material is also referred to as ultrananocrystalline diamond (UNCD).

(2) Description of Related Art

Bulk acoustic wave devices are also known. These find use as filters and in sensors. In general diamond is surrounded by one or more piezoelectric films or plates.

SAW devices function as transducers in that electromagnetic wave energy is converted to sound acoustic energy and then back to electrical wave energy at a particular frequency or frequencies, thus in a preferred use they act as filters. Surface acoustic wave (SAW) devices have found several key applications in radio frequency and microwave electronics (Campbell, C., Surface Acoustic Wave Devices and Their Signal Processing Applications, Academic Press, New York (1989)). They offer a high degree of frequency selectivity with low insertion loss making them highly suitable for use as narrow band filters. SAW devices are particularly well adapted to microwave integrated circuits since they can provide a significant size reduction over purely electromagnetic devices. This is a consequence of the small ratio of acoustic to electromagnetic wavelengths which, at a given frequency, is of order $v/c \sim 10^{-4}$, where v and c are the speeds of a surface acoustic wave and of light, respectively.

SAW devices are most typically implemented on piezoelectric substrates (quartz, lithium niobate) on which thin metal film interdigitated transducers (IDT) are fabricated using photolithography. The operating frequency f of a device is determined by the IDT period p which sets the wavelength of the surface wave $\lambda$. For example, a monolithic SAW device with IDT period 4 $\mu$m operates near 1 GHz for $v \sim 4 \times 10^3$ m s$^{-1}$ since $f = v/\lambda$. A simple IDT is typically composed of several finger pairs of length $\sim 100 \lambda$ with a finger width p/4. More complex designs with multiple pairs per wavelength and higher resonant frequencies tend to push the limits of conventional photolithography.

The use of diamond as a SAW substrate offers an attractive means for relaxing the lithographic criteria (Yamanouchi, K. et al., Proceedings IEEE Ultrasonics Symposium 351 (1989)). With a surface wave velocity $v \sim 1 \times 10^4$ m s$^{-1}$, diamond allows SAW device operation near 2.5 GHz with nominal 1 $\mu$m linewidth. Since diamond is not piezoelectric, additional complexity is introduced by a requisite overlayer of a piezoelectric thin-film, typically ZnO. Sound propagation in layered media may be highly dispersive and in general admits a multiplicity of allowed modes. Nevertheless, highly successful devices based on ZnO/polycrystalline diamond/Si layered structures have been reported, where the diamond layers have been grown by hot filament or CVD (chemical vapor deposition) techniques (Nakahata H., et al., Proceedings IEEE Ultrasonics symposium 377 (1992); Nakahata, Y. H. et al., ibid 361 (1995); Fujii, S., et al., ibid 183 (1997); Dreifus, K. L., et al., ibid 191 (1997); Nakahata, H., et al., ibid 319 (1998); and Hachigo, A., et al., ibid 325 (1995)).

Various U.S. patents which describe SAW devices are U.S. Pat. No. 6,051,063 to Tanabe et al., U.S. Pat. No. 5,814,149 to Shintani et al., U.S. Pat. No. 5,486,800 to Davenport, U.S. Pat. No. 5,773,911 to Tanaka et al., U.S. Pat. No. 5,920,143 to Tarui et al., and U.S. Pat. No. 6,127,768 to Stoner et al. which are incorporated herein by reference.

Nanocrystalline diamond (NCD) is a new form of diamond. See U.S. Pat. Nos. 5,989,511; 5,849,079; 5,772,760; 5,209,916 to Gruen; U.S. Pat. No. 5,328,676 to Gruen; U.S. Pat. No. 5,370,855 to Gruen; U.S. Pat. No. 5,462,776 to Gruen; U.S. Pat. No. 5,620,512 to Gruen; U.S. Pat. No. 5,571,577 to Zhang et al; U.S. Pat. No. 5,645,645 to Zhang et al; U.S. Pat. No. 5,897,924 to Ulczynski et al and U.S. Pat. No. 5,902,640 to Krauss. Its growth and characterization have been reviewed (Gruen, D. M., Annu. Rev. Mater. Sci. 29 211 (1999)). It differs from diamond-like carbon in that it contains relatively little hydrogen or sp$^2$-bonded carbon. The grain size of NCD can be controlled by deposition conditions such as temperature, gas pressure, and hydrogen content. A distribution of grain sizes d is present in most deposits, with 1 nm<d<50 nm. As d decreases, an increasing fraction of the carbon content resides in or near grain boundaries.

For mechanical applications, the properties of NCD films that are most attractive are the naturally occurring smooth surfaces, a result of the small crystallite size, as well as its elastic isotropy for length scales >>d. These are quite relevant for SAW applications, since standard polycrystalline diamond on Si is quite rough and must be smoothed by mechanical polishing before photolithographic processing can be attempted.

Furthermore, one expects acoustic scattering at large angle grain boundaries in polycrystalline diamond, especially if lateral grain dimensions exist on length scales between acoustic wavelengths (~1 $\mu$m) and SAW device apertures and transducer separations. The use of NCD would eliminate these concerns provided the elastic properties of NCD are not inferior to high-quality polycrystalline (or even single crystal) diamond.

OBJECTS

The objects of the present invention are twofold. First, to show that the elastic response of unpolished nanocrystalline diamond is suitable for SAW devices by propagating surface acoustic waves in the 1 GHz regime. Second, to record the utility of NCD as a substrate for SAW devices by fabricating IDT structures on as-grown NCD films. Thus, it is an object of the present invention to provide unpolished nanocrystalline diamond based SAW devices which have high velocities (over $1 \times 10^4$ meters per second). These and other objects will become increasingly apparent by reference to the following description and the drawings.

SUMMARY OF THE INVENTION

It has unexpectedly been found that a SAW device, operating in the GHz region could be fabricated using photolithography (or electron beam lithography) without recourse to polishing of the diamond. It was found that the device of the present invention performs in an equivalent, or superior way, to polished polycrystalline diamond SAW devices.

The present invention relates to an improvement in an acoustic wave device which comprises an unpolished nanocrystalline diamond film having a grain size distribution between about 1 and 50 nm as a carrier of the acoustic wave.

The present invention also relates to a surface acoustic wave (SAW) device which comprises: a substrate having a surface which has been processed to allow enhanced nucleation of diamond; a nominally unpolished nanocrystalline diamond film deposited on and adhered to the surface of the substrate and having a diamond grain size distribution between 1 nm and 50 nm; metal electrodes deposited on the diamond film, or the piezoelectric overlayer, as interdigitated elements; and a piezoelectric composition coated over the diamond and metal electrodes, or with electrodes atop the piezoelectric composition, wherein the surface acoustic wave is created on the diamond by electrical waves supplied to the electrodes which strain the piezoelectric composition to produce the surface acoustic wave on the diamond.

The nanocrystalline diamond film is preferably formed in a microwave reactor with an insulated cavity containing argon, with a concentration of 90% by volume or greater, methane and optionally hydrogen at a pressure between 50 and 300 Torr at a flow rate between about 50 and 600 sccm, and a temperature of the substrate of 600° to 800° C., essentially in the absence of nitrogen or oxygen.

The piezoelectric composition is preferably a polycrystalline metal oxide, although piezoelectric polymers can also be used such as poly(vinylidene) fluoride. The piezoelectric metal oxide coating is preferably deposited by sputtering zinc or zinc oxide in an argon and oxygen atmosphere. The metal electrodes are preferably aluminum or other readily evaporated metal such as silver, gold, platinum or palladium. The substrate is preferably silicon.

To nucleate diamond, the surface of the substrate can be roughened or scratched with powdered diamond or other abrasive materials which are removed from the surface with a volatile organic solvent washing. Low energy ion bombardment can also be used. The electrodes are preferably produced on the diamond using photolithography or electron beam lithography. The diamond film is preferably greater than several micrometers thick and the piezoelectric composition coating is preferably between 0.5 and 2.0 micrometers thick.

The present invention also relates to a surface acoustic wave device which comprises unpolished nanocrystalline diamond film with a grain size between 1 nm and 50 nanometers with metal electrodes and a piezoelectric material deposited on the diamond film and electrodes to provide an interdigital transducer for microwaves.

In general, as sensors, surface acoustic wave (SAW) devices are more sensitive than the bulk acoustic wave devices because the wave energy is confined to the surface, the property of which is subject to modification by the environment.

As a sensor, each SAW device consists of a transmitter and a receiver separated by an intermediate area. The property change of this intermediate area by chemical adsorption is reflected as a change of either the propagation loss or the delay time for the signal to reach the receiver from the transmitter. Therefore in real devices, either the loss, delay time, or acoustic impedance is measured.

DESCRIPTION OF PREFERRED EMBODIMENTS

Surface acoustic wave (SAW) devices based on polycrystalline diamond have recently achieved success as microwave filters. This is due in part to the large acoustic wavelength of diamond at microwave frequencies, a consequence of its high surface wave velocity, and the resulting ability to use photolithography for transducer fabrication. Since nanocrystalline diamond has smooth surfaces and is elastically isotropic, it offers considerable advantages over thick films of polycrystalline diamond. The propagation of surface waves on nanocrystalline diamond prepared by microwave plasma CVD on silicon substrates was examined. Films were synthesized on 75 mm Si wafers using input gas mixtures consisting of Ar with 1% $CH_4$ and 0 to 4% $H_2$. The deposition parameters studied included pressure, 2.45 GHz microwave power, and total gas flow rate. Film thicknesses up to 23 µm were produced. SAW transducers were fabricated by photolithography on as-grown nanocrystalline diamond surfaces covered with a 1 to 3 µm overlayer of oriented polycrystalline piezoelectric ZnO prepared by reactive dc sputtering.

Device response was analyzed with frequency and time domain methods. The resonant frequencies of the devices agree with the results of numerical solutions for sound propagation in layered media. Several surface acoustic modes exist at frequencies between 0.5 and 1 GHz that exhibit appreciable dispersion. Surface waves have been propagated in nanocrystalline diamond over distances varying from 0.1 to 5 mm with low attenuation. For a film with mean grain size of approximately 30 nm, the SAW velocity is similar to test devices on thick polycrystalline diamond. It is concluded that nanocrystalline diamond is a highly attractive substrate material for SAW devices, possessing the high sound velocity of diamond but requiring less materials processing. This is the first determination of elastic properties of nanocrystalline diamond and the fabrication of nanocrystalline diamond surface acoustic wave devices.

The present Example shows successful fabrication of SAW devices on 23 µm thick NCD substrates. The surface acoustic wave velocity on unpolished NCD is indistinguishable from polycrystalline diamond. Thus, nanocrystalline diamond is a superior replacement for polycrystalline diamond in high-frequency SAW devices.

Nanocrystalline Diamond Growth

Figure 1:
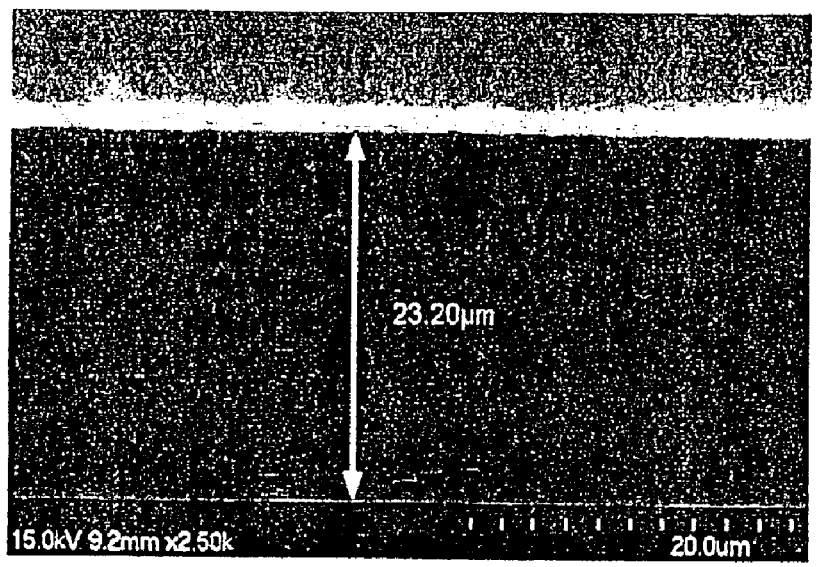
FIG. 1 is a scanning electron microscope image of a fracture surface of nanocrystalline diamond grown on a Si substrate.

Nanocrystalline diamond was grown on 75 mm (001) Si wafers scratch-seeded with diamond powder. Growth took place in a 2.45 GHZ microwave plasma CVD chamber in which the plasma was confined by a 12.5 cm diameter hemispherical fused quartz dome and the substrate (Kuo, K. P. and J. Asmussen, Diamond Relat. Mater. 6 1097 (1997)). The feed gases consisted of Ar, $H_2$, and $CH_4$ in the ratios 100:4:1, respectively. A total pressure of 160 Torr and a substrate temperature of 670° C. were maintained at an input microwave power of 1.1 kW. NCD films grown under these conditions exhibited a rms surface roughness of 50 nm with relatively low residual internal stress. A cross-sectional scanning electron microscope (SEM) image of a fracture surface is shown in FIG. 1 for a 23 μm film used in the present SAW studies.

Figure 2:
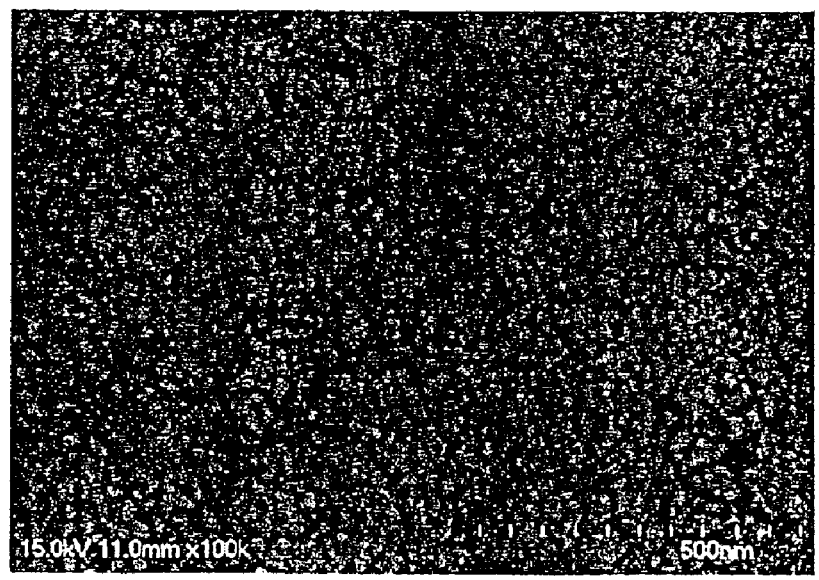
FIG. 2 is a scanning electron micrograph of the growth surface of a nanocrystalline diamond film used for surface acoustic wave device studies.

A field-emission SEM image of the growth surface of this film is shown in FIG. 2. If one interprets the dark regions as the interstitial material surrounding the grains, one can infer a distribution of grain sizes with a mean lateral cross-sectional dimension of approximately 30 nm. This should be regarded as an upper limit on the average grain size as there is some evidence for grain coarsening as growth proceeds from the substrate.

Surface Acoustic Wave Device Fabrication

Figure 3:
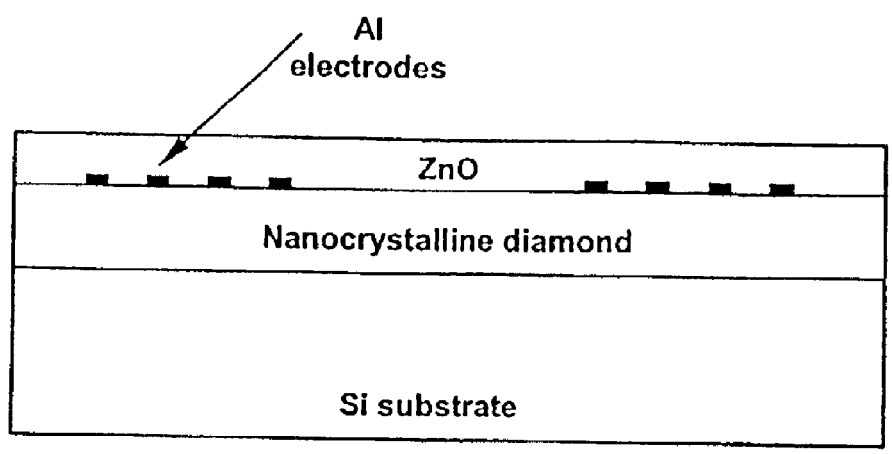
FIG. 3 is a schematic cross-sectional diagram of the surface acoustic wave device multilayer structure (not to scale).

The structure of the SAW device is shown schematically in FIG. 3. Photolithographic IDTs consisting of 100 nm thick Al electrodes were prepared on the NCD growth surface by thermal evaporation followed by liftoff processing. No polishing or etching of the NCD surface was attempted. Unapodised double ($\lambda/8$) or single ($\lambda/4$) electrodes were used with 2.5 μm or 3.0 μm finger widths, respectively. IDT apertures were typically 900 μm and inter-IDT distances varied from 100 to 5000 μm.

Figure 4:
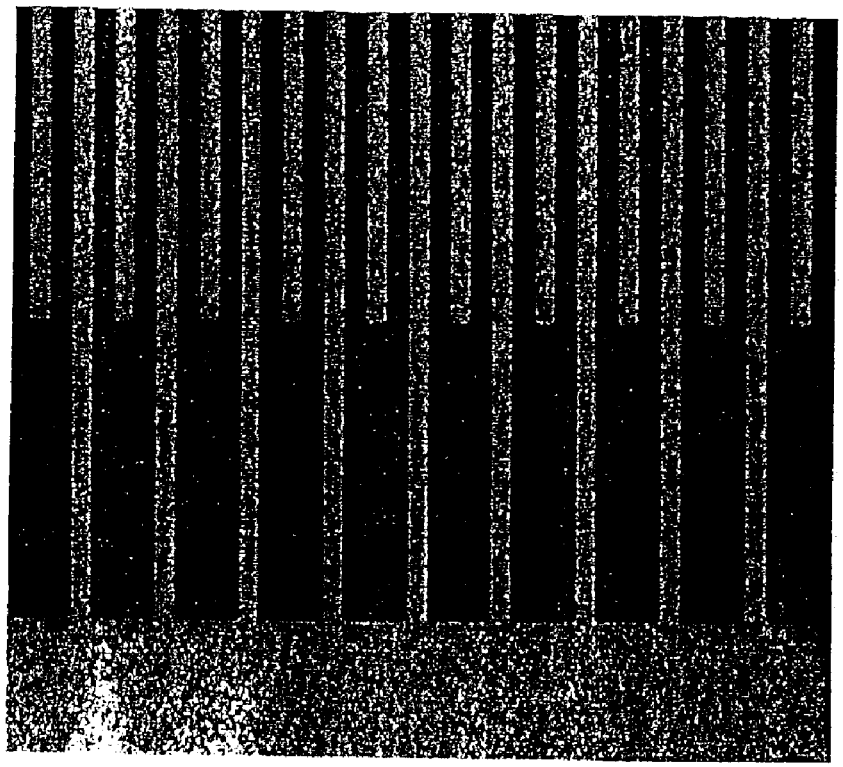
FIG. 4 is an optical micrograph of Al interdigitated electrodes on the as-grown surface of nanocrystalline diamond. The lateral dimension of each electrode finger is 3 µm.

FIG. 4 is an optical micrograph of the top surface of a portion of a SAW device subsequent to Al deposition. The smoothness of the NCD substrate is evident from the high regularity and smooth edges of the 3 μm Al fingers After IDT preparation, ZnO was deposited at thicknesses $h_{ZnO}$ between 0.5 and 2.5 μm. DC triode sputtering in 85% Ar/15% $O_2$ at 5 mTorr produced c-axis textured polycrystalline ZnO (Foster, N. F., et al., J. Vac. Sci. and Tech. 6 111 (1969)). Other processes are possible such as reactive sputtering of zinc or microwave CVD.

SAW Device Calculations

A matrix-based approach was used to calculate the modal velocities of the ZnO/diamond/Si multilayers (Adler, E. L., et al., Proceedings IEEE Ultrasonics Symposium 341 (1995)). The (100) Si substrate was treated as an infinite half-space. Calculations of the surface wave phase velocity as a function of the $kh_{dia}$ and $kh_{ZnO}$ were performed, where the wavevector modulus $k=2\pi/\lambda$ and $\lambda$ is the acoustic wavelength. It has been shown that for $kh_{dia}>4$ the Si substrate plays an insignificant role, a condition satisfied for these experimental conditions. Therefore, $kh_{dia}=4$ in the numerical calculations. The isotropic NCD layer was treated either as a (001) oriented crystalline diamond layer with $c_{11}=1076$, $c_{12}=125$, and $c_{44}=576$ (McSkimin, H. J., et al., Phys. Rev. 105 116 (1957)) or as an isotropic medium with $c_{11}=1156$ and $c_{44}=536$, with elastic stiffnesses $c_{ij}$ in GPa. Dispersion curves for the two lowest modes are indistinguishable for these two cases in the measurement range studied. The crystalline mass density was taken as $3.5 \times 10^3$ kg $m^{-3}$, consistent with direct measurements on NCD. The calculations agree well with previously published results where they overlap (Nakahata, K., et al., IEEE Trans. Ultrason., Ferroelect., and Freq. Cont. 42 362 (1995)).

Results

SAW devices were studied using frequency and time-domain methods. Phase velocities were obtained from device resonant frequencies measured with a network analyzer. Group velocities were measured using time-of-flight techniques. All measurements were made at room temperature (23.5° C.); no impedance matching structures were employed.

Figure 5:
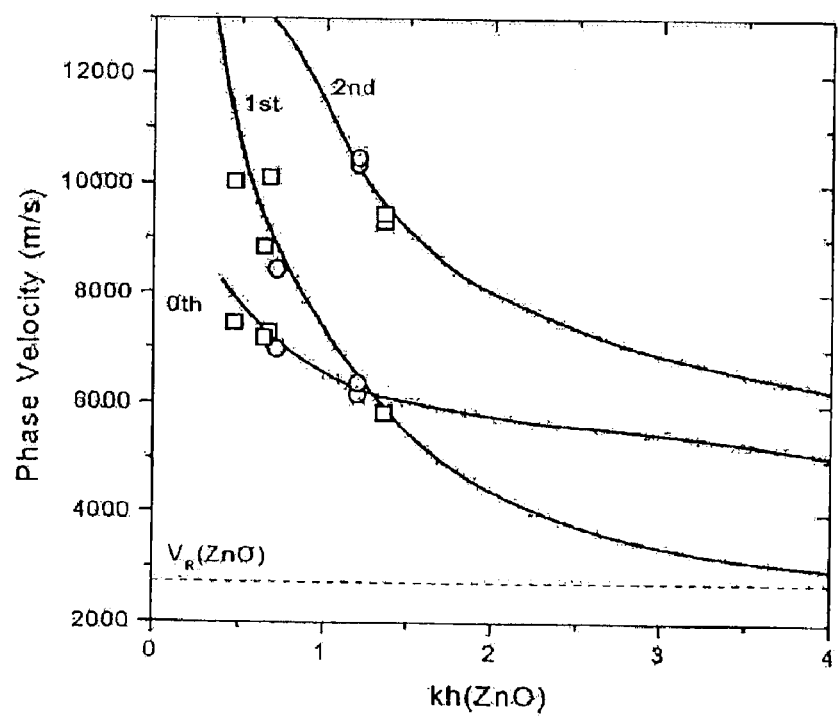
FIG. 5 is a graph showing phase velocities as measured for surface waves on nanocrystalline diamond (□) and on large-grain polished polycrystalline diamond (○). Here, k is the wave vector ($2\pi/\lambda$, where $\lambda$ is the wavelength of sound in ZnO). The solid lines represent calculations of phase velocities based on single crystal diamond material parameters. The labels denote the Rayleigh mode indices for the layered medium. The dashed line shows the Rayleigh wave velocity on ZnO.

FIG. 5 shows a compilation of experimental results (symbols) and calculations(lines) of the phase velocity v as a function of $kh_{ZnO}$ (with $kh_{dia}=4$). It is evident that several modes are allowed for a given value of $kh_{ZnO}$. The modes are highly dispersive at small values of $kh_{ZnO}$, i.e., the phase velocity is strongly dependent on $kh_{ZnO}$. As expected, the lowest order mode tends toward the phase velocity of the Rayleigh wave on (0001) ZnO at large $kh_{ZnO}$ but approaches the diamond Rayleigh wave velocity as $kh_{ZnO} \rightarrow 0$.

The experimental data agree well with the calculated dispersion curves. The data indicated by the symbols (□) represent results for SAW devices on NCD substrates. The symbols (○) represent devices built on thick polycrystalline substrates used as control devices (Polished polycrystalline 300 μm thick plates were supplied by Diamonex Corp.) The close correspondence clearly demonstrates that SAW devices based on unpolished nanocrystalline and on polished polycrystalline substrates are indistinguishable (within combined uncertainties). Both agree well with the calculated dispersion curves based on single crystal or elastically isotropic diamond. It is emphasized that SAW velocities over $1 \times 10^4$ m $s^{-1}$ have been realized on nanocrystalline diamond in this Example.

Conclusions

It has been shown that nanocrystalline diamond can be prepared by microwave plasma CVD with properties that enable it to be used readily for high-frequency surface acoustic wave devices. The elastic properties of the nanocrystalline diamond used in the present study are strikingly similar to the polycrystalline diamond. However, NCD offers distinct advantages over typical polycrystalline diamond: elastic isotropy, absence of grain boundary scattering, and smooth as-grown surfaces.

Investigations of the elastic properties of hydrogenated diamond-like carbon (Jiang, X., Phys. Rev. B 43 2372 (1991)) and tetrahedrally-coordinated amorphous carbon (Ferrari, A. C., et al., Appl. Phys. Lett. 75 1893 (1999)) have shown elastic stiffnesses, even in the low-hydrogen limit, that are significantly lower than nanocrystalline and polycrystalline diamond.

Where the sensor is diamond, it is resistant to abrasion. Also the diamond allows biosensors to be bonded to a surface for use in assays.

It is intended that the foregoing description be only illustrative of the present invention and that the present invention be limited only by the hereinafter appended claims.

We claim:

1. A surface acoustic wave (SAW) device which comprises:
   (a) a substrate having a surface which has been processed to allow enhanced nucleation of diamond;
   (b) a nominally unpolished nanocrystalline diamond film deposited on and adhered to the surface of the substrate and having a diamond grain size distribution between 1 nm and 50 nm wherein the nanocrystalline diamond film is formed in a microwave reactor containing argon, with a concentration of 90% by volume or greater, methane and optionally hydrogen at a pressure between 50 and 300 Torr at a flow rate between about 50 and 600 sccm, and a temperature of the substrate of 600° to 800° C., essentially in the absence of nitrogen or oxygen;

(c) electrodes deposited on the diamond film, or the piezoelectric overlayer, as interdigitated elements; and (d) a piezoelectric composition coated over the diamond and electrodes, or with electrodes atop the piezoelectric composition, wherein the surface acoustic wave is created on the diamond by electrical waves supplied to the electrodes which strain the piezoelectric composition to produce the surface acoustic wave on the diamond, wherein the SAW device has acoustic wave velocities which have a close correspondence to calculated velocities based upon single crystal diamond values.

2. The device of claim 1, wherein the substrate has been processed by scratch seeding, by bias-enhanced nucleation, or ion bombardment before deposition of the diamond film.

3. The device of any one of claims 1 or 2 wherein the piezoelectric composition is a polycrystalline metal oxide composition or a polymer composition.

4. The device of any one of claims 1 or 2 wherein the metal electrodes are selected from the group consisting of aluminum, gold, silver, platinum and palladium.

5. The device of any one of claims 1 or 2 wherein the substrate is silicon, wherein the metal electrodes are aluminum and wherein the piezoelectric composition is zinc oxide.

6. The device of claim 1 wherein the piezoelectric composition is deposited by sputtering zinc oxide in an argon and oxygen atmosphere.

7. The device of any one of claims 1 or 2 wherein the surface is roughened or scratched for depositing the diamond.

8. The device of any one of claims 1 or 2 wherein the electrodes are produced on the diamond or the piezoelectric film using photolithography or electron beam lithography.

9. The device of any one of claims 1 or 2 wherein the diamond film is several micrometers thick and the piezoelectric metal oxide coating is between 0.5 and 2.0 micrometers thick.

10. A surface acoustic wave device which comprises unpolished nanocrystalline diamond film with a grain size between 1 nm and 50 nanometers with metal electrodes and a piezoelectric material deposited on the diamond film and electrodes to provide an interdigital transducer for microwaves, wherein the nanocrystalline diamond film is formed in a microwave reactor containing argon, with a concentration of 90% by volume or greater, methane and optionally hydrogen at a pressure between 50 and 300 Torr at a flow rate between about 50 and 600 sccm, and a temperature of the substrate of 600° to 800° C., essentially in the absence of nitrogen or oxygen, and wherein the SAW device has acoustic wave velocities which have a close correspondence to calculated velocities based upon single crystal diamond values.

11. The device of claim 1 or 10 wherein the acoustic wave velocities are over 10,000 meters/sec.

* * * * *